(12) United States Patent
Ono et al.

(10) Patent No.: US 8,421,468 B2
(45) Date of Patent: Apr. 16, 2013

(54) INTERNAL RESISTANCE ESTIMATION APPARATUS FOR POWER STORAGE DEVICE, DEGRADATION DETERMINATION APPARATUS FOR POWER STORAGE DEVICE, POWER SUPPLY SYSTEM, AND INTERNAL RESISTANCE ESTIMATION METHOD FOR POWER STORAGE DEVICE

(75) Inventors: Toshikazu Ono, Toyota (JP); Hichirosai Oyobe, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 12/900,957

(22) Filed: Oct. 8, 2010

(65) Prior Publication Data
US 2011/0133744 A1 Jun. 9, 2011

(30) Foreign Application Priority Data
Dec. 8, 2009 (JP) ................................. 2009-278359

(51) Int. Cl.
*G01R 31/36* (2006.01)
(52) U.S. Cl.
USPC .......................................... 324/430; 324/433
(58) Field of Classification Search .................. 324/430, 324/433
See application file for complete search history.

(56) References Cited

U.S. PATENT DOCUMENTS
2009/0051364 A1* 2/2009 Ishida et al. .................. 324/430

FOREIGN PATENT DOCUMENTS

| | | |
|---|---|---|
| CN | 1791804 A | 6/2006 |
| CN | 101243325 A | 8/2008 |
| DE | 1 938 076 | 2/1971 |
| DE | 102 09 136 A1 | 9/2003 |
| DE | 10 2007 061 130 A1 | 7/2008 |
| JP | 08196082 A * | 7/1996 |
| JP | 2006-006073 | 1/2006 |
| JP | 2007-12568 | 1/2007 |
| JP | 2008-175556 | 7/2008 |
| JP | 2009-128194 | 6/2009 |
| JP | 2010-259217 | 11/2010 |
| JP | 2011-018532 | 1/2011 |

OTHER PUBLICATIONS

JPO Decision to Grant Patent for corresponding Japanese Patent Application No. 2009-278359 mailed Oct. 11, 2011.
German Office Action issued Feb. 13, 2012, in German Patent Application No. 10 2010 043 870.7 (with English Translation).
Chinese Office Action issued Feb. 29, 2012, in China Patent Application No. 201010586126.3 (with English Translation).

* cited by examiner

*Primary Examiner* — Vincent Q Nguyen
(74) *Attorney, Agent, or Firm* — Oblon, Spivak, McClelland, Maier & Neustadt, L.L.P.

(57) ABSTRACT

A converter control unit responds to a command from a start determining unit to control a converter such that a ripple current is generated at a secondary battery. A storage unit stores a map defining a correlative relationship between the temperature and current of the secondary battery and internal resistance. An estimating unit estimates a value of internal resistance of the secondary battery based on each detection value of the temperature and current, and the map stored in the storage unit.

9 Claims, 8 Drawing Sheets

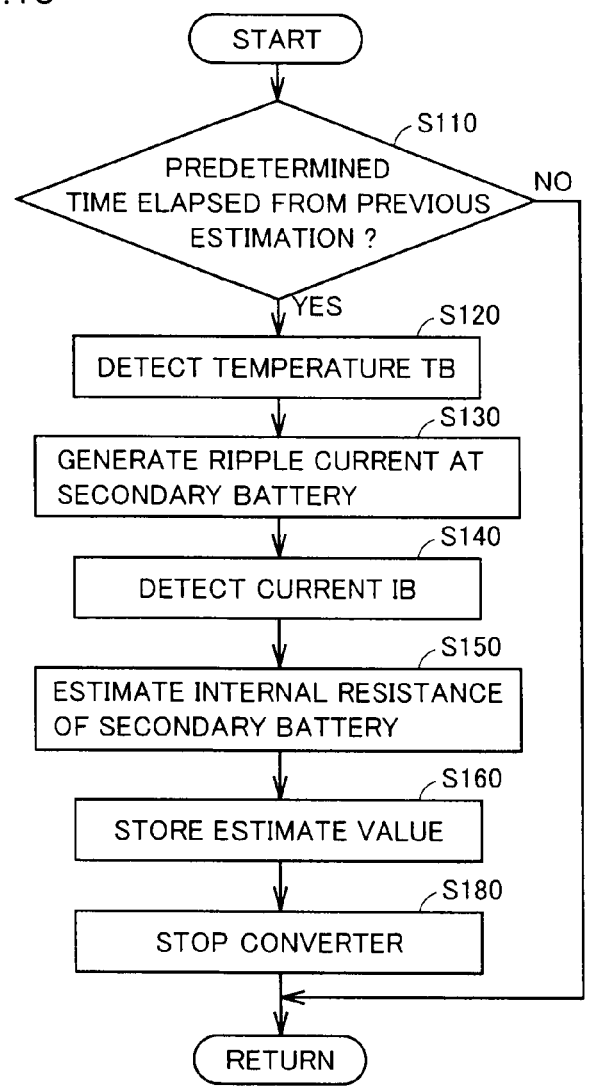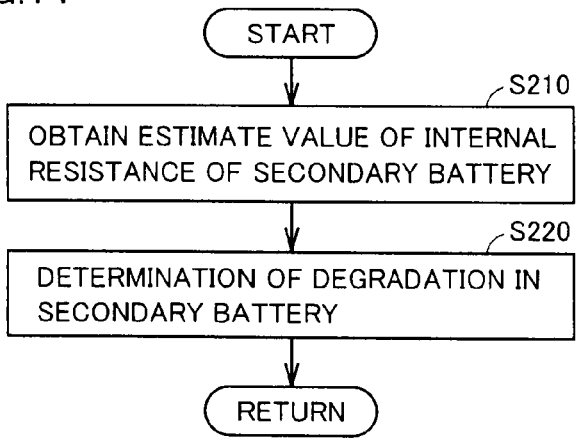

INTERNAL RESISTANCE ESTIMATION APPARATUS FOR POWER STORAGE DEVICE, DEGRADATION DETERMINATION APPARATUS FOR POWER STORAGE DEVICE, POWER SUPPLY SYSTEM, AND INTERNAL RESISTANCE ESTIMATION METHOD FOR POWER STORAGE DEVICE

This nonprovisional application is based on Japanese Patent Application No. 2009-278359 filed on Dec. 8, 2009 with the Japan Patent Office, the entire contents of which are hereby incorporated by reference.

BACKGROUND OF THE INVENTION

1. Field of the Invention

The present invention relates to an apparatus and method for estimating the internal resistance of a power storage device, an apparatus for determining degradation in the power storage device based on the internal resistance, and a power supply system including a power storage device.

2. Description of the Background Art

Japanese Patent Laying-Open No. 2009-128194 (Patent Document 1), for example, discloses a device to determine degradation in a rechargeable battery. The device includes current detection means for detecting current flowing into a rechargeable battery, ripple factor calculation means for calculating the ripple factor of the detected current, storage means for storing in advance data associating the ripple factor with the internal resistance, and determination means. The ripple factor calculation means divides the current detected by the current detection means into a ripple component and a direct current component, and calculates the ratio of the ripple component to the direct current component as the ripple factor. The determination means calculates the internal resistance of the rechargeable battery based on the data stored in the storage means and the ripple factor calculated by the ripple factor calculation means to determine whether the rechargeable battery is degraded or not based on the internal resistance.

Japanese Patent Laying-Open No. 2007-12568 (Patent Document 2), for example, discloses a control device generating a ripple current at a secondary battery to raise the temperature of the secondary battery. The passage of a ripple current through the internal resistor of the secondary battery causes heat generation in the secondary battery. The temperature of the secondary battery can be increased without using a heater by the heat generation of the secondary battery per se.

The internal resistance of a power storage device generally has temperature dependency. However, the internal resistance of a rechargeable battery is calculated based on only the ripple component, according to Japanese Patent Laying-Open No. 2009-128194. Therefore, the temperature dependency of the internal resistance may affect the determination of degradation in the rechargeable battery according to the method disclosed in Japanese Patent Laying-Open No. 2009-128194. Japanese Patent Laying-Open No. 2007-12568 is silent about estimating the internal resistance of the power storage device, although a method of utilizing the internal resistance of the power storage device is disclosed.

SUMMARY OF THE INVENTION

An object of the present invention is to provide the technique of allowing estimation of the internal resistance of a power storage device with high accuracy.

An internal resistance estimation apparatus for a power storage device according to an aspect of the present invention includes a ripple generation unit, a current detection unit, a temperature detection unit, a storage unit, and an estimating unit. The ripple generation unit is configured to generate a ripple current of a predetermined frequency at a power storage device. The current detection unit is configured to detect the ripple current. The temperature detection unit is configured to detect the temperature of the power storage device. The storage unit is configured to store a predetermined correlative relationship between the temperature and ripple current of the power storage device, and the internal resistance of the power storage device. The estimating unit is configured to estimate the internal resistance based on the ripple current detected by the current detection unit, the temperature detected by the temperature detection unit, and the correlative relationship stored in the storage unit.

Preferably, the internal resistance estimation apparatus further includes a determining unit. The determining unit is configured to determine whether warm-up control to increase the temperature of the power storage device is required or not based on the temperature detected by the temperature detection unit. The ripple generation unit generates a ripple current at the power storage device when the determining unit determines that warm-up control is required.

Preferably, the estimating unit is configured to obtain a current value of the ripple current from the current detection unit during one period of the ripple current, and estimate the internal resistance based on the current value, the temperature, and the correlative relationship.

Preferably, the ripple generation unit includes a voltage converter configured to convert the level of DC voltage between the power storage device and a load driven by electric power supplied from the power storage device. The voltage converter includes a switching element subjected to ON/OFF control at a period according to a carrier frequency, and a reactor connected in series with the switching element to the power storage device. The internal resistance estimation device further includes a frequency setting unit for setting the carrier frequency at a predetermined frequency.

Preferably, the power storage device includes a secondary battery.

A degradation determination apparatus for a power storage device according to another aspect of the present invention includes a ripple generation unit, a current detection unit, a temperature detection unit, a storage unit, an estimating unit, and a degradation determining unit. The ripple generation unit is configured to generate a ripple current of a predetermined frequency at the power storage device. The current detection unit is configured to detect a ripple current. The temperature detection unit is configured to detect the temperature of the power storage device. The storage unit is configured to store a predetermined correlative relationship between the temperature and the ripple current of the power storage device, and the internal resistance of the power storage device. The estimating unit is configured to estimate the internal resistance based on the ripple current detected by the current detection unit, the temperature detected by the temperature detection unit, and the correlative relationship stored in the storage unit. The degradation determining unit is configured to determine whether the power storage device is degraded based on the internal resistance estimated by the estimating unit.

A power supply system according to another aspect of the present invention is directed to supplying electric power to a load mounted on a vehicle. The power supply system includes a power storage device, and a voltage converter. The voltage converter is configured to convert the level of DC voltage between the power storage device and the load. The voltage converter includes a switching element subjected to ON/OFF control at a period according to a carrier frequency, and a reactor connected in series with the switching element to the power storage device. The power supply system further includes a frequency setting unit, a current detection unit, a temperature detection unit, a storage unit, and an estimating unit. The frequency setting unit is configured to set the carrier frequency at a first frequency directed to generating a ripple current at the power storage device when estimating the internal resistance of the power storage device, and to set the carrier frequency at a second frequency higher than the first frequency when driving a load. The current detection unit is configured to detect a ripple current. The temperature detection unit is configured to detect the temperature of the power storage device. The storage unit is configured to store a predetermined correlative relationship between the temperature and ripple current of the power storage device, and the internal resistance of the power storage device. The estimating unit is configured to estimate the internal resistance based on the ripple current detected by the current detection unit, the temperature detected by the temperature detection unit, and the correlative relationship stored in the storage unit.

Preferably, the frequency setting unit is configured to adjust the second frequency based on the internal resistance estimated by the estimating unit.

Preferably, the load includes an AC motor, and an inverter configured to allow conversion of the DC voltage supplied from the voltage converter into AC voltage to drive the AC motor.

A power supply system according to still another aspect of the present invention is directed to an internal resistance estimation method for a power storage device, including the steps of generating a ripple current of a predetermined frequency at the power storage device, detecting a ripple current, detecting a temperature of the power storage device, and estimating the internal resistance by using a predetermined correlative relationship between the temperature and ripple current of the power storage device, and the internal resistance of the power storage device. The step of estimating includes the step of estimating the internal resistance based on the correlative relationship, the detected ripple current, and the detected temperature.

Preferably, the internal resistance estimation method further includes the step of determining whether warm-up control to increase the temperature of the power storage device is required or not based on the detected temperature. The step of generating includes the step of generating a ripple current at the power storage device when determination is made that warm-up control is required.

Preferably, the step of estimating obtains a current value of the ripple current for one period of the ripple current. The step of estimating estimates the internal resistance based on the current value, temperature, and correlative relationship.

The main advantage of the present invention lies in that the internal resistance of the power storage device can be estimated with high accuracy.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a flowchart to describe a second estimation process according to an embodiment.

FIG. 14 is a flowchart representing a determination process by a degradation determining unit shown in FIG. 2.

DESCRIPTION OF THE PREFERRED EMBODIMENTS

Figure 1:
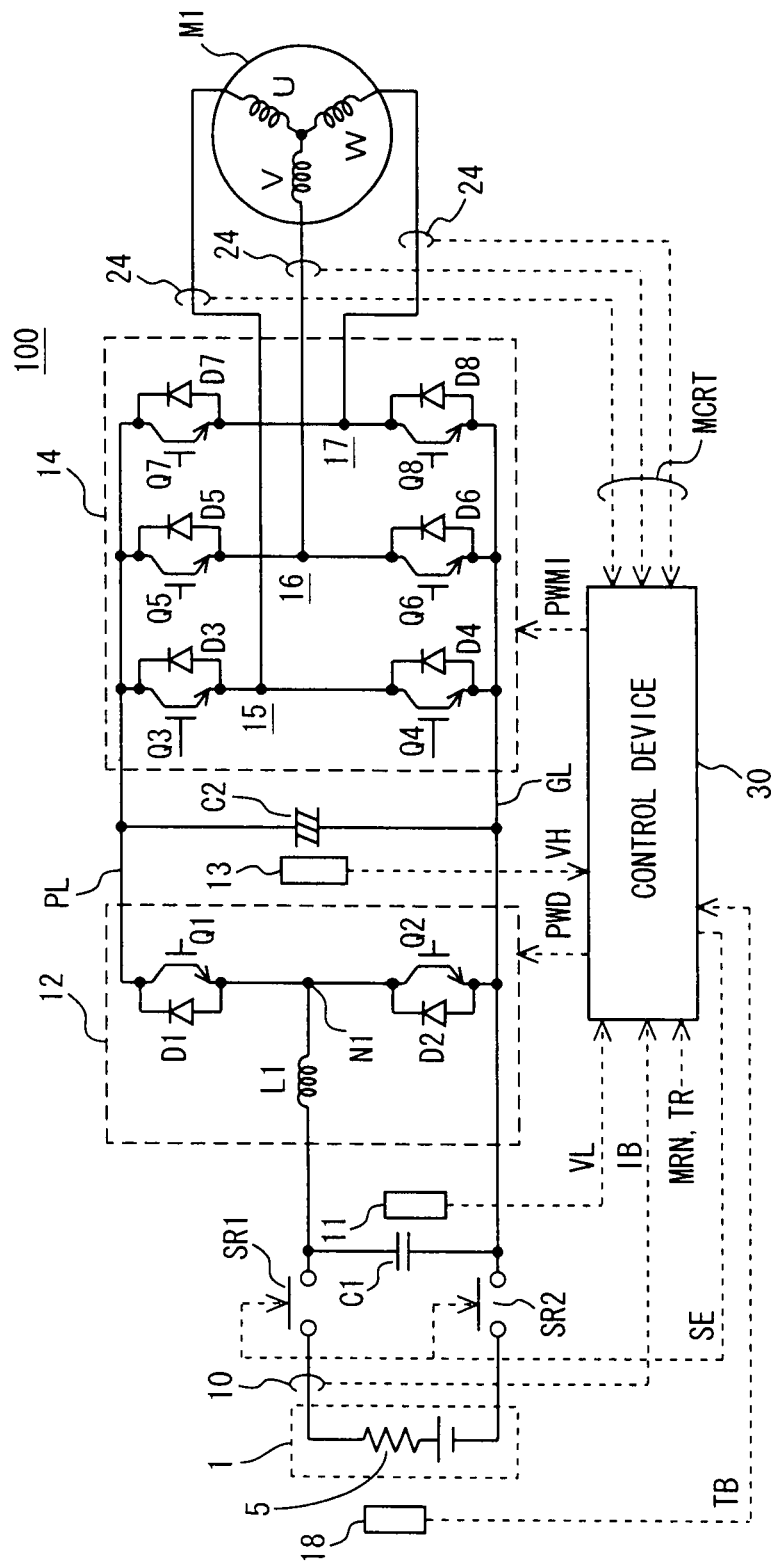
FIG. 1 is a schematic block diagram of a motor drive apparatus to which an estimation device according to an embodiment of the present invention is applied.

Embodiments of the present invention will be described hereinafter in detail with reference to the drawings. In the drawings, the same or corresponding elements have the same reference characters allotted, and description thereof will not be repeated.

FIG. 1 is a schematic block diagram of a motor drive apparatus to which an estimation device according to an embodiment of the present invention is applied. Referring to FIG. 1, a motor drive apparatus 100 includes a secondary battery 1, a current sensor 10, voltage sensors 11 and 13, a temperature sensor 18, a current sensor 24, system relays SR1 and SR2, capacitors C1 and C2, a converter 12, an inverter 14, and a control device 30.

The motor drive apparatus shown in FIG. 1 is incorporated in an electric powered vehicle such as a hybrid vehicle, an electric vehicle, and a fuel cell vehicle. In the present specification, "electric powered vehicle" is defined as a vehicle mounted with a power storage device and a motor capable of generating driving force by the electric power supplied from the power storage device.

An AC motor M1 is incorporated in the electric powered vehicle to drive a driving wheel. In the case of a hybrid vehicle, AC motor M1 may be incorporated as a motor generator having the capability of both a power generator driven by the engine and an electric motor starting the engine.

Secondary battery 1 is a rechargeable power storage device. For example, a nickel-metal hydride battery, a lithium ion battery or the like can be used as secondary battery 1. An internal resistance 5 of secondary battery 1 is estimated by control device 30.

Current sensor 10 detects a current IB of secondary battery 1, and outputs a detection value thereof to control device 30. Hereinafter, current IB is also referred to as battery current IB. Temperature sensor 18 detects a temperature TB of secondary battery 1, and outputs a detection value thereof to control device 30. The motor drive apparatus may further include a voltage sensor to detect the voltage of secondary battery 1.

System relays SR1 and SR2 are turned ON and OFF by a signal SE from control device 30.

Capacitor C1 smoothes voltage VB supplied from secondary battery 1. Voltage sensor 11 detects the voltage across the terminals of capacitor C1, i.e. the voltage input to converter 12, and outputs the detected voltage VL to control device 30.

Converter 12 includes a reactor L1, IGBT (Insulated Gate Bipolar Transistor) elements Q1 and Q2, and diodes D1 and D2. In the present embodiment, an IGBT element is applied as a power switching element (hereinafter, simply referred to as "switching element") included in converter 12 and inverter 14. A power MOS (Metal Oxide Semiconductor) transistor may also be employed as a switching element instead of an IGBT element.

Reactor L1 has one end electrically connected to a positive electrode of secondary battery 1 via system relay SR1, and the other end connected to a node N1 corresponding to an intermediate point of IGBT element Q1 and IGBT element Q2. Namely, reactor L1 is connected in series to the switching element.

IGBT elements Q1 and Q2 are connected in series between a power supply line PL and a ground line GL. IGBT element Q1 has its collector connected to power supply line PL. IGBT element Q2 has its emitter connected to ground line GL.

Diodes D1 and D2 are connected to IGBT elements Q1 and Q2, respectively, in an anti-parallel manner. Ground line GL is electrically connected to a negative electrode of secondary battery 1 via system relay SR2.

Capacitor C2 smoothes voltage VH between power supply line PL and ground line GL. Voltage VH is the output voltage from converter 12, and the input voltage to inverter 14. Hereinafter, voltage VH is also referred to as "system voltage". Voltage sensor 13 detects system voltage VH, and outputs the detected voltage VH to control device 30.

Converter 12 executes voltage conversion bidirectionally between DC voltage VL supplied from secondary battery 1 to capacitor C1 and system voltage VH. Specifically, converter 12 renders IGBT elements Q1 and Q2 ON and OFF according to a signal PWD from control device 30 to control system voltage VH. Basically, IGBT elements Q1 and Q2 are rendered ON and OFF alternately and in a complementary manner.

Inverter 14 includes an U-phase arm 15, a V-phase arm 16, and a W-phase arm 17. U-phase arm 15, V-phase arm 16, and W-phase arm 17 are provided in parallel between power supply line PL and ground line GL. Each phase arm includes two IGBT elements connected in series between power supply line PL and ground line GL, and two anti-parallel diodes connected to the two IGBT elements, respectively.

Specifically, U-phase arm 15 includes IGBT elements Q3 and Q4, and diodes D3 and D4 connected to IGBT elements Q3 and Q4, respectively, in an anti-parallel manner. V-phase arm 16 includes IGBT elements Q5 and Q6, and diodes D5 and D6 connected to IGBT elements Q5 and Q6, respectively, in an anti-parallel manner. W-phase arm 17 includes IGBT elements Q7 and Q8, and diodes D7 and D8 connected to IGBT elements Q7 and Q8, respectively, in an anti-parallel manner.

The intermediate point of each phase arm is connected to an end of a corresponding phase coil of AC motor M1.

Namely, AC motor M1 is a 3-phase permanent magnet motor. Each of the U-phase coil, V-phase coil and W-phase coil has one end connected in common to the neutral point. The U-phase coil has the other end connected to the intermediate point of IGBT elements Q3 and Q4. The V-phase coil has the other end connected to the intermediate point of IGBT elements Q5 and Q6. The W-phase coil has the other end connected to the intermediate point of IGBT elements Q7 and Q8.

Current sensor 24 detects a motor current MCRT flowing to AC motor M1, and outputs the detected motor current MCRT to control device 30.

Inverter 14 responds to a signal PWMI from control device 30 to convert system voltage VH output from converter 12 into AC voltage, and supplies the AC voltage to AC motor M1. AC motor M1 responds to the supply of an AC current from inverter 14 to generate torque specified by a torque command value TR.

In a regenerative braking mode of the electric powered vehicle mounted with motor drive device 100, AC motor M1 generates AC voltage. At this stage, control device 30 generates a signal PWMI such that inverter 14 converts the AC voltage into DC voltage. The DC voltage from inverter 14 is supplied to secondary battery 1 via capacitor C2 and converter 12.

The aforementioned "regenerative braking" includes braking in association with regeneration when the driver of the electric powered vehicle operates the footbrake, as well as reducing the vehicle speed (or ceasing acceleration) while effecting regeneration at the AC motor by rendering the accelerator pedal off during running without operating the footbrake.

Inverter 14 and AC motor M1 are loads driven by the electric power supplied from secondary battery 1. Converter 12 converts the level of the DC voltage between secondary battery 1 and the load.

Control device 30 is constituted of an electronic control unit (ECU) to control the operation of motor drive device 100 by software processing through a CPU (Central Processing Unit) executing a program and/or hardware processing by a dedicated electronic circuit. Specifically, control device 30 generates a signal PWD to drive converter 12 and a signal PWMI to drive inverter 14 based on a torque command value TR, motor speed MRN, voltage VL from voltage sensor 11, voltage VH from voltage sensor 13, and motor current MCRT from current sensor 24. Control device 30 outputs the generated signals PWD and PWMI to converter 12 and inverter 14, respectively.

Signal PWD functions to control the DC voltage conversion by converter 12, specifically, to control switching of IGBT elements Q1 and Q2. Control device 30 generates a signal PWD such that system voltage VH coincides with a voltage command value VR. In order to generate signal PWD, control device 30 adjusts the carrier frequency used in the ON/OFF control of IGBT elements Q1 and Q2 of converter 12.

Signal PWMI functions to control the DC/AC conversion by inverter 14, specifically, to control the ON/OFF of IGBT elements Q3-Q8. Control device 30 generates signal PWMI such that the output torque of AC motor M1 coincides with a torque command value TR.

When torque command value TR takes a positive value, AC motor M1 generates the driving force of the electric powered vehicle. In a regenerative braking mode of the electric powered vehicle, torque command value TR is set at a negative value. At this stage, control device 30 generates signal PWMI such that the regenerative power (AC voltage) generated by AC motor M1 is converted into DC voltage by inverter 14.

Converter 12 down-converts the DC voltage from inverter 14 according to signal PWD from control device 30, and supplies the down-converted voltage to secondary battery 1.

Control device 30 also generates a signal SE to turn ON/OFF system relays SR1 and SR2 according to an activation/stop command of motor drive device 100, and provides the generated signal to system relays SR1 and SR2.

According to the present embodiment, at least converter 12, temperature sensor 18, current sensor 10 and control device 30 constitute an estimation apparatus to estimate the internal resistance of a secondary battery, a determination apparatus to determine degradation in a secondary battery, and a power supply system to supply electric power to a load.

Figure 2:
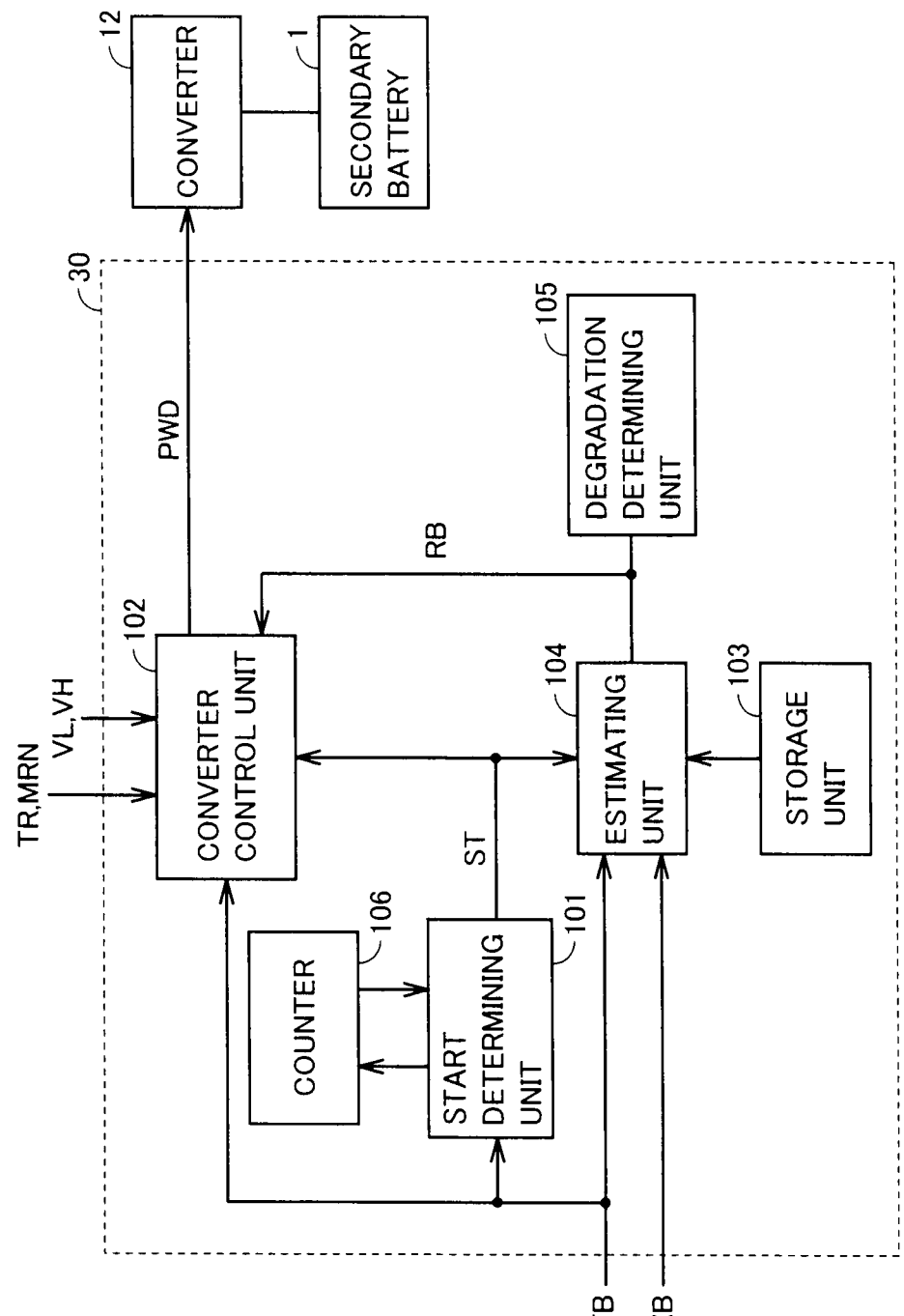
FIG. 2 is a functional block diagram of a portion of the control device shown in FIG. 1, related to estimation of the internal resistance of a secondary battery 1 and converter control.

FIG. 2 is a functional block diagram of a portion of the control device of FIG. 1, related to estimation of the internal resistance of secondary battery 1 and converter control. Each functional block of FIG. 2 may be configured by an electronic circuit (hardware) having capability corresponding to a relevant block, or may be implemented by an ECU executing software processing according to a preset program.

Referring to FIG. 2, control device 30 includes a start determining unit 101, a converter control unit 102, a storage unit 103, an estimating unit 104, a degradation determining unit 105, and a counter 106.

Start determining unit 101 determines whether a condition to start estimation of an internal resistance 5 of secondary battery 1 is met or not. Start determining unit 101 determines that the condition to start estimation of internal resistance 5 is met when a temperature TB of secondary battery 1 is lower than a predetermined temperature Tth. Further, start determining unit 101 determines that the condition to start estimation of internal resistance 5 is met when a predetermined time has elapsed from the previous estimation, based on a count value of a counter 106. In the case where start determining unit 101 determines that a start condition is met, start determining unit 101 outputs to converter control unit 102 and estimating unit 104 a command ST to start estimation of internal resistance 5 of secondary battery 1.

Converter control unit 102 generates a control signal PWD to control converter 12 based on a torque command value TR, motor speed MRN, and voltages VL, VH, and outputs generated control signal PWD to converter 12. Specifically, converter control unit 102 controls converter 12 to generate a ripple current at secondary battery 1 according to a command ST from start determining unit 101. In other words, converter 12 functions as a ripple generation unit to generate a ripple current at secondary battery 1.

In the case where start determining unit 101 does not output command ST, converter control unit 102 executes normal control on converter 12. Normal control refers to control for converter 12 to execute DC voltage conversion bidirectionally between voltage VL and voltage VH.

Storage unit 103 stores a map defining the correlative relationship between temperature TB and current IB of the secondary battery and an internal resistance value RB. In the present embodiment, storage unit 103 stores the above-described correlative relationship in the form of a map. The correlative relationship may also be stored in the form of a table or function in storage unit 103.

Estimating unit 104 responds to a command ST from start determining unit 101 to estimate a value of the internal resistance in secondary battery 1. Specifically, estimating unit 104 estimates the value of the internal resistance of secondary battery 1 based on respective detection values of temperature TB and current IB, and the map stored in storage unit 103.

Estimating unit 104 outputs an estimate value (RB) of the internal resistance to converter control unit 102 and degradation determining unit 105.

Converter control unit 102 receives the estimate value from estimating unit 104, and modifies the carrier frequency in order to generate control signal PWD based on the estimate value. Degradation determining unit 105 receives an estimate value from estimating unit 104, and determines whether secondary battery 1 is degraded or not based on the estimate value.

Counter 106 counts the elapsed time starting from an output of command ST from start determining unit 101, and outputs the count value to start determining unit 101. When the counted value of counter 106 reaches a predetermined value, start determining unit 101 outputs a command ST and clears the count value in counter 106. Start determining unit 101 outputs a command ST every time the count value of counter 106 attains a predetermined value. Therefore, the internal resistance of secondary battery 1 can be estimated periodically.

Figure 3:
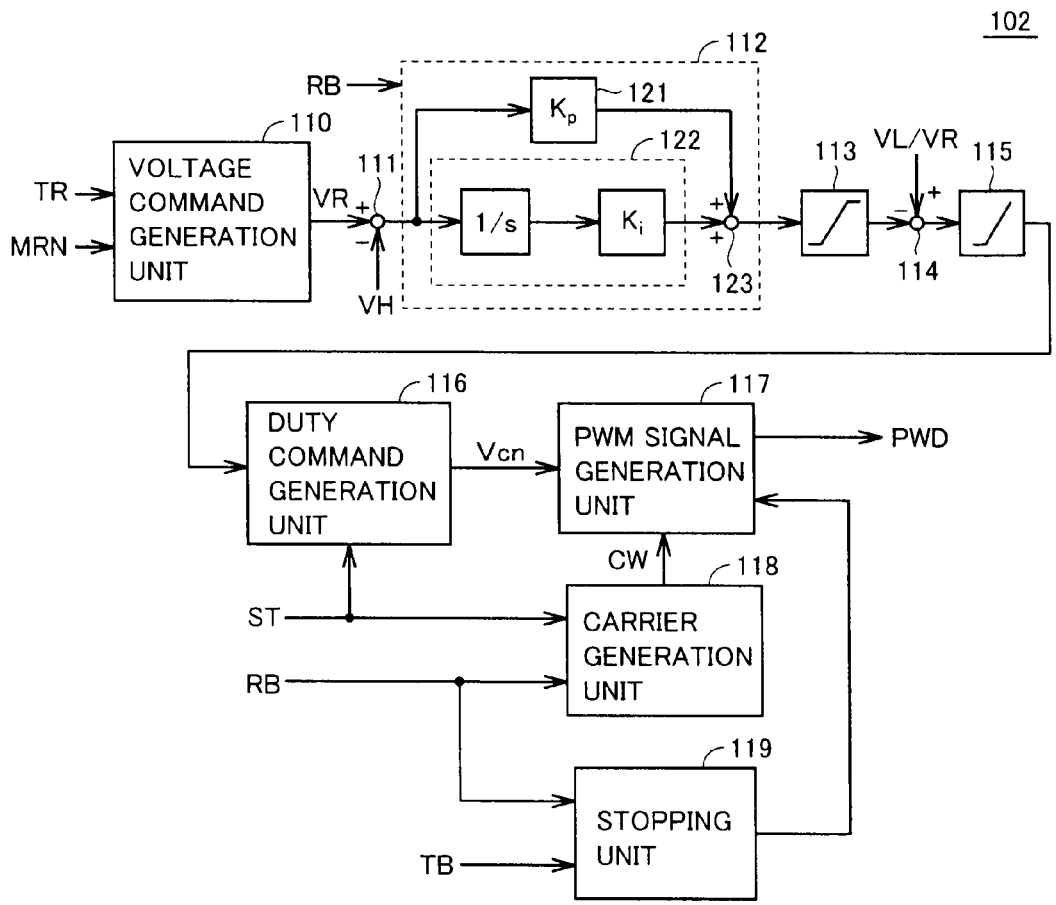
FIG. 3 is functional block diagram to describe an exemplified configuration of a converter control unit shown in FIG. 2.

FIG. 3 is a functional block diagram to describe an exemplified configuration of the converter control unit shown in FIG. 2. Referring to FIG. 3, converter control unit 102 includes a voltage command generation unit 110, a subtracter 111, a feedback control unit 112, a guard unit 113, a subtracter 114, a guard unit 115, a duty command generation unit 116, a PWM (Pulse Width Modulation) signal generation unit 117, a carrier generation unit 118, and a stopping unit 119.

Voltage command generation unit 110 calculates the required power of AC motor M1 based on torque command value TR and motor speed MRN, and generates a voltage command value VR based on the calculated power.

Subtracter 111 generates the deviation between voltage command value VR and voltage VH. Feedback control unit 112 executes feedback control such that voltage VH coincides with voltage command value VR, based on the deviation generated by subtracter 111. Specifically, feedback control unit 112 executes proportional-integral control.

Feedback control unit 112 includes a proportional control calculation unit 121, an integral control calculation unit 122, and an adder 123. Proportional control calculation unit 121 calculates the control amount related to proportional control (proportional term) based on the product of the deviation and a predetermined proportional gain. Integral control calculation unit 122 calculates the control amount related to integral control (integral term) based on the integral value of the deviation and the predetermined integral gain. Adder 123 adds the proportional term and integral term.

Moreover, feedback control unit 112 changes the feedback gain (proportional gain and integral gain) based on the estimate value (RB) of the internal resistance of secondary battery 1. Specifically, feedback control unit 112 reduces the feedback gain as the estimate value (RB) becomes lower.

Guard unit 113 restricts the output value of feedback control unit 112 within a range from a first lower limit to a first upper limit. Subtracter 114 subtracts the output value of guard unit 113 from the reciprocal number of the theoretical boost ratio of converter 12, indicated by VL/VR. The input term (VL/VR) of subtracter 114 is a feed forward compensation term based on the theoretical boost ratio of converter 12.

Guard unit 115 restricts the output value of subtracter 114 such that it does not become lower than a second lower limit.

Duty command generation unit 116 generates a duty command Vcn representing the duty ratio of IGBT elements Q1 and Q2 of converter 12 based on the output value from guard unit 115. Duty command generation unit 116 generates, upon receiving a command ST from start determining unit 101, a duty command Vcn such that the duty ratio is a fixed value (for example 0.5).

PWM signal generation unit 117 compares duty command Vcn from duty command generation unit 116 with a carrier wave CW from carrier generation unit 118 to generate a signal PWD based on the comparison result. Specifically, PWM signal generation unit 117 compares the voltage of duty command Vcn with the voltage of carrier wave CW.

Carrier generation unit 118 generates a carrier wave CW, and outputs that carrier wave CW to PWM signal generation unit 117. Carrier wave CW is, for example, a triangular wave. Carrier generation unit 118 generates a carrier wave CW having a predetermined frequency (for example, 1 kHz) in response to a command ST to start estimation of the internal resistance of secondary battery 1. In the case where a command ST is not input to carrier generation unit 118, carrier generation unit 118 adjusts the frequency of carrier wave CW based on the estimate value (RB) of the internal resistance of secondary battery 1. At this stage, the frequency of carrier wave CW is higher than that when the internal resistance of secondary battery 1 is estimated, and is approximately 10 to 20 kHz, for example. The frequency of carrier wave CW is also called "carrier frequency" hereinafter.

Stopping unit 119 transmits to PWM signal generation unit 117 a command to stop generation of control signal PWD. Stopping the generation of control signal PWD by PWM signal generation unit 117 causes converter 12 to stop. Accordingly, warm-up control ends. Specifically, when temperature TB of secondary battery 1 becomes higher than a predetermined ending temperature, stopping unit 119 transmits to PWM signal generation unit 117 a command to stop generation of control signal PWD.

Moreover, when warm-up control is not executed and estimation of the internal resistance is executed, estimate value RB of the internal resistance is input to stopping unit 119. In this case, stopping unit 119 sends to PWM signal generation unit 117 a command to stop generation of control signal PWD.

Figure 4:
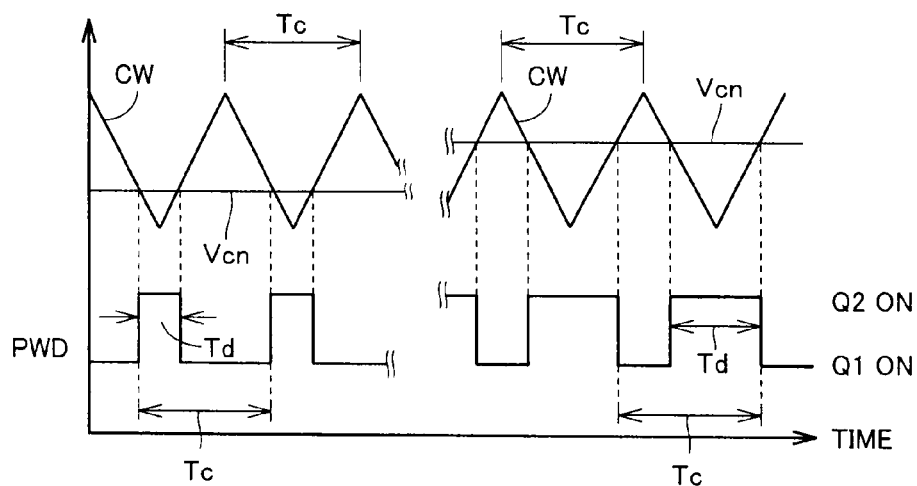
FIG. 4 is a waveform diagram to describe an operation of a PWM signal generation unit shown in FIG. 3.

FIG. 4 is a waveform diagram to describe an operation of the PWM signal generation unit shown in FIG. 3. Referring to FIG. 4, carrier wave CW has a period of Tc. During the period of time where duty command Vcn is higher than carrier wave CW, IGBT element Q2 is rendered ON whereas IGBT element Q1 is rendered OFF. In contrast, during the period of time where duty command Vcn is lower than carrier wave CW, IGBT element Q1 is rendered ON whereas IGBT element Q2 is rendered OFF.

The increase of the ON duty of IGBT element Q2 causes the power stored at reactor L1 to become larger. Accordingly, system voltage VH is boosted. In contrast, system voltage VH is lowered by a greater ON duty of IGBT element Q1. By modifying duty command Vcn according to voltage command value VR, system voltage VH can be controlled to become equal to or higher than voltage VB of secondary battery 1.

Figure 5:
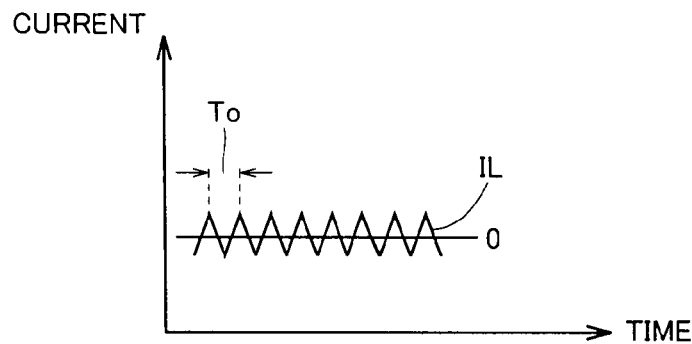
FIG. 5 represents a reactor current waveform in a normal operation mode of a converter.

FIG. 5 represents a reactor current waveform in a normal operation mode of the converter. In a normal operation mode of converter 12, converter 12 executes voltage conversion bidirectionally between voltage VB of secondary battery 1 and system voltage VH.

Referring to FIG. 5, reactor current IL is increased during the ON term of IGBT element Q2 (OFF term of IGBT element Q1). In contrast, reactor current IL is decreased during an ON term of IGBT element Q1 (OFF term of IGBT element Q2). Increase and decrease of reactor current IL is repeated at a period determined by the reciprocal of the carrier frequency. Therefore, a ripple current is generated according to the carrier frequency.

In a normal mode, a ripple current of period To is generated as reactor current IL. Period To is the reciprocal of carrier frequency fo. In order to suppress electromagnetic noise, a frequency of approximately 10 to 20 kHz, for example, is selected as carrier frequency fo in a normal mode.

Figure 6:
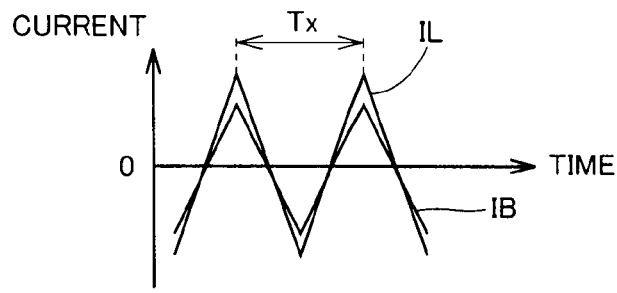
FIG. 6 schematically represents a waveform of a reactor current and a battery current in an estimation mode of the internal resistance of a secondary battery.

FIG. 6 schematically represents a waveform of a reactor current and a battery current in an estimation mode of the internal resistance of the secondary battery. Referring to FIG. 6, when in an estimation mode of the internal resistance of the secondary battery, the carrier frequency is set at a frequency fx that is lower than frequency fo of a normal mode. Therefore, the variation period Tx of reactor current IL becomes longer than period To indicated in FIG. 5.

By the internal resistance and the current input to and output from secondary battery 1, heat is generated at secondary battery 1. The heat generated at secondary battery 1 increases as the amplitude of the ripple current becomes larger. Therefore, by operating converter 12 such that a ripple current is generated from secondary battery 1, the temperature of secondary battery 1 can be increased. In the present embodiment, the internal resistance of secondary battery 1 is estimated during execution of warm-up control of secondary battery 1 taking advantage of a ripple current.

Capacitor C2 connected to power supply line PL is used as a power buffer temporarily storing the discharging electric power from secondary battery 1. In other words, in warm-up control, reactor current IL can be generated as an AC current without the input or output of electric power with respect to a load constituted of inverter 14 and AC motor M1.

Figure 7:
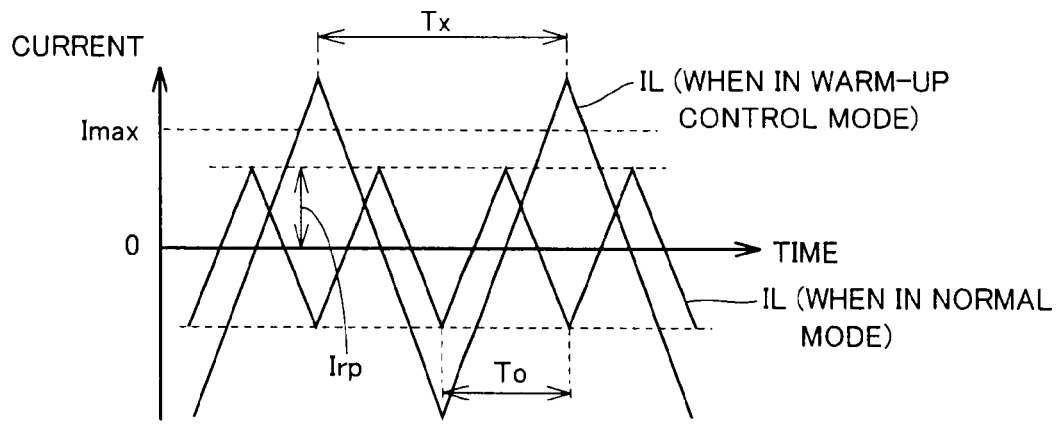
FIG. 7 is a diagram to describe the relationship between the carrier frequency and amplitude of the ripple current.

FIG. 7 is a diagram to describe the relationship between the carrier frequency and the ripple current amplitude. Referring to FIG. 7, during an ON term of IGBT element Q2 (OFF term of IGBT element Q1), reactor current IL rises at an inclination (VL/L) determined by an inductance L of reactor L1 and voltage VL. During an ON term of IGBT element Q1 (OFF term of IGBT element Q2), reactor current IL is decreased at an inclination ((VL−VH)/L) determined by inductance L and the voltage difference (VH−VL).

In warm-up control, the carrier frequency is decreased from fo to fx. Namely, the carrier period becomes longer from To to Tx. In this case, a ripple current amplitude Irp is increased since the rising period of time or reduction period of time of reactor current IL becomes longer.

The duty ratio is fixed when carrier frequency is fx, as mentioned above. For example, the duty ratio is set at 50%. When the duty ratio is 50%, the ON term of IGBT element Q1 becomes equal to the ON term of IGBT element Q2. Therefore, the inclination of the ripple current during the rising period of the current can be set equal to the inclination of the ripple current during the reduction period of the current.

Battery current IB is expressed as IB=(E−VB)/RB, where E is the electromotive force of secondary battery 1. In other words, battery current IB varies according to the internal resistance of the secondary battery. Since battery current IB becomes higher during warm-up control, the internal resistance of the secondary battery can be estimated more easily. Therefore, the internal resistance of secondary battery 1 is estimated during a warm-up control mode in the present embodiment.

It is to be noted that the internal resistance of the secondary battery has temperature dependency. In the case where the internal resistance is estimated without taking into account the temperature of the secondary battery, the estimation accuracy of the internal resistance will be degraded. In the present embodiment, the internal resistance is estimated based on the battery current and battery temperature. Specifically, estimating unit 104 (refer to FIG. 2) estimates a value of the internal resistance of secondary battery 1 based on current IB detected by current sensor 10, temperature TB detected by temperature sensor 18, and a map stored in storage unit 103. This map is prepared in advance by experiments and the like to be pre-stored in storage unit 103.

Figure 8:
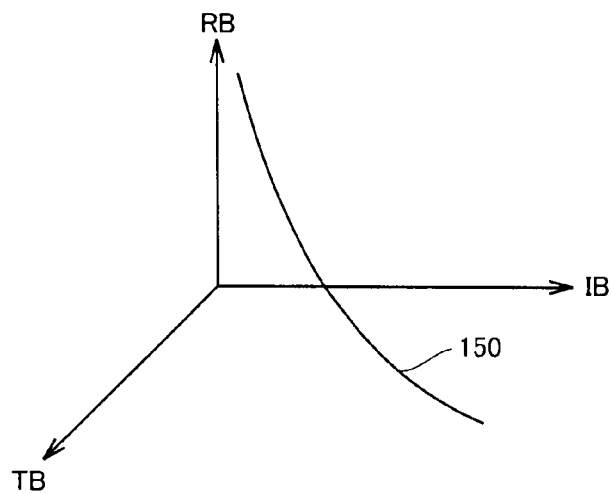
FIG. 8 is a diagram to describe a map stored in a storage unit shown in FIG. 2.
Figure 9:
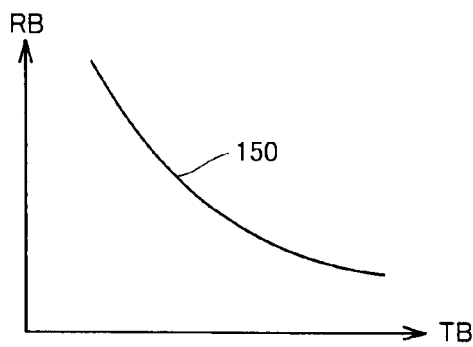
FIG. 9 is a diagram to describe the relationship between the internal resistance and temperature.
Figure 10:
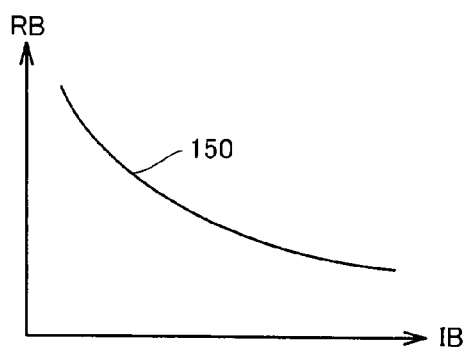
FIG. 10 is a diagram to describe the relationship between the internal resistance and current.

FIG. 8 is a diagram to describe a map stored in the storage unit shown in FIG. 2. FIG. 9 is a diagram to describe the relationship between the internal resistance and temperature. FIG. 10 is a diagram to describe the relationship between the internal resistance and current.

Referring to FIGS. 8-10, the map is represented by a three-dimensional coordinate system defined by an axis of temperature TB, an axis of current IB, and an axis of resistance RB. Curve 150 represents a function f to calculate resistance RB based on temperature TB and current IB. Namely, resistance RB can be expressed as RB=f (TB, IB).

FIGS. 9 and 10 represent the change in resistance RB when one of temperature TB and current IB is fixed and the other varied. The value of resistance RB becomes larger as the temperature becomes lower. Current IB becomes smaller as the value of resistance RB becomes larger.

The value of the internal resistance becomes higher according to degradation in secondary battery 1. However, the internal resistance also becomes higher in the case where the temperature becomes lower. In the case where the internal resistance is estimated based on only the current when the temperature of the battery is low, for example, there is a possibility of the internal resistance being estimated higher. If degradation in the secondary battery is determined based on such an estimate value, an erroneous determination may be made that the degradation of the secondary battery is more advanced than it actually is. Since the internal resistance is estimated based on both temperature TB and current IB in the present embodiment, the internal resistance of the secondary battery can be estimated with higher accuracy. Therefore, the degradation state of the secondary battery can be determined with higher accuracy.

Figure 11:
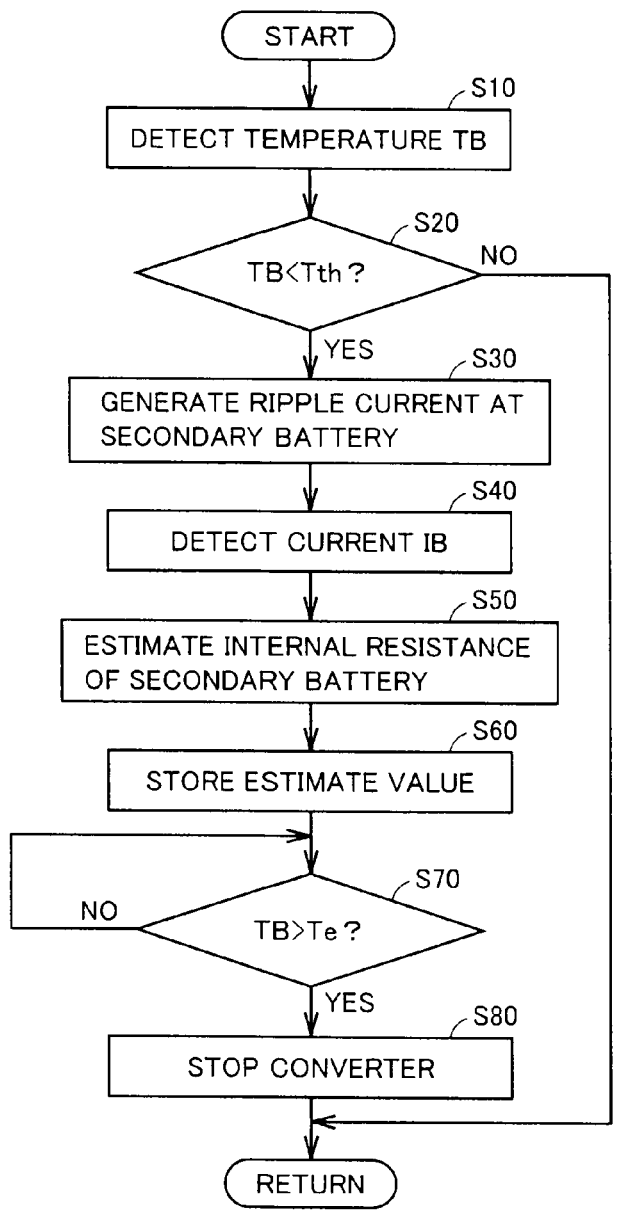
FIG. 11 is a flowchart to describe a first estimation process according to an embodiment.

FIG. 11 is a flowchart to describe a first estimation process according to the present embodiment. The series of processes indicated in the flowchart is invoked from the main routine when a predetermined condition is met or at a predetermined operation cycle to be executed by control device 30.

Referring to FIG. 11, control device 30 detects temperature TB of secondary battery 1 at step S10. Specifically, control device 30 receives a detection value from temperature sensor 18.

At step S20, control device 30 determines whether temperature TB of secondary battery 1 is lower than a predetermined temperature Tth. Specifically, start determining unit 101 compares temperature TB with predetermined temperature Tth and determines whether temperature TB is lower than predetermined temperature Tth or not.

When a determination is made that temperature TB is lower than predetermined temperature Tth (YES at step S20), process proceeds to step S30. In this case, warm-up control is executed, together with estimation of the internal resistance of the secondary battery. When a determination is made that temperature TB is higher than predetermined temperature Tth (NO at step S20), the entire processing is returned to the main routine. In this case, warm-up control and estimation of the internal resistance of the secondary battery are both not executed.

At step S30, start determining unit 101 outputs a command ST to converter control unit 102 and estimating unit 104 to estimate the internal resistance of secondary battery 1. Converter control unit 102 (carrier generation unit 118) responds to command ST to set the carrier frequency at fx. Converter control unit 102 (duty command generation unit 116) sets the duty ratio at a predetermined value (for example, 0.5). Thus, converter 12 causes generation of a ripple current having a waveform shown in FIG. 6 at secondary battery 1.

At step S40, control device 30 detects current IB of secondary battery 1. Specifically, control device 30 obtains a detection value from current sensor 10. For example, control device 30 samples the detection value of current sensor 10. The sampling period is shorter than the period Tx determined by carrier frequency fx (refer to FIG. 6).

The internal resistance of a secondary battery becomes lower by the rise of the temperature at the secondary battery, as set forth above. Thus, there is a possibility of current IB becoming larger during execution of warm-up control. The temperature of the secondary battery is detected prior to starting warm-up control. Therefore, in order to improve the accuracy of estimation, current IB of the secondary battery is preferably detected at the time of starting warm-up control.

Figure 12:
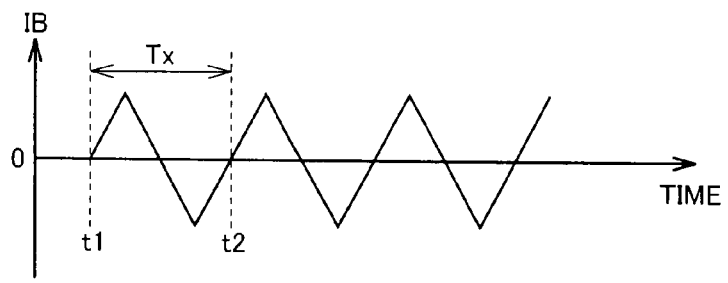
FIG. 12 is a waveform diagram to describe the current of a secondary battery in an execution mode of warm-up control.

FIG. 12 is a waveform diagram to describe the current of the secondary battery at the time of execution of warm-up control. Referring to FIG. 12, warm-up control is initiated at time t1. Current IB has a period of Tx. Control device 30 obtains a detection value of current IB during period Tx. Specifically, control device 30 obtains a detection value of current IB from time t1 to time t2, i.e. within a period of time starting from an initiation of warm-up control until elapse of period Tx.

Referring to FIG. 11, control device 30 estimates the internal resistance of secondary battery 1 at step S50. Specifically, estimating unit 104 estimates the internal resistance based on temperature TB detected at step S10, current IB detected at step S40, and the map stored in storage unit 103.

At step S60, control device 30 stores the estimate value. For example, the estimate value is stored at estimating unit 104.

At step S70, control device 30 determines whether warm-up control is to be ended or not. Specifically, control device 30 determines whether temperature TB of secondary battery 1 is higher than an ending temperature Te of warm-up control. Converter control unit 102 (stopping unit 119) compares temperature TB with temperature Te and determines whether temperature TB is higher than temperature Te.

When a determination is made that temperature TB is higher than temperature Te (YES at step S70), control proceeds to step S80. When a determination is made that temperature TB is equal to or lower than temperature Te (NO at step S70), the process of step S70 is repeated.

At step S80, control device 30 stops converter 12. Specifically, converter control unit 102 stops the generation of control signal PWD. Therefore, warm-up control ends. Upon ending the process of step S80, the entire processing is returned to the main routine.

By the processing set forth above, the internal resistance of the secondary battery at the time of execution of warm-up control can be estimated. The internal resistance of a secondary battery varies greatly within a wide temperature range from a normal temperature (for example, 25° C.) to a low temperature (for example, −30° C.). By estimating the internal resistance at the temperature requiring warm-up control, the internal resistance can be estimated with high accuracy.

However, according to the process set forth above, the internal resistance of the secondary battery cannot be estimated unless warm-up control is executed. In the present embodiment, the internal resistance of the secondary battery is also estimated when a predetermined period of time has elapsed from the previous estimation. Accordingly, the internal resistance of a secondary battery can be estimated even in the case where warm-up control is not required.

FIG. 13 is a flowchart to describe a second estimation process according to the present embodiment. The series of processes indicated in the flowchart is invoked from the main routine when a predetermined condition is met or at a predetermined operation cycle to be executed by control device 30.

Referring to FIG. 13, control device 30 determines whether a predetermined time has elapsed from the previous estimation at step S110. Specifically, start determining unit 101 determines whether the count value of counter 106 has reached a predetermined value.

When the count value of counter 106 has reached a predetermined value, start determining unit 101 determines that a predetermined time has elapsed from the previous estimation. In this case (YES at step S110), process proceeds to step S120. Therefore, an estimation process is executed.

In the case where the count value of counter 106 has not reached the predetermined value, start determining unit 101 determines that the elapsed time from the previous estimation has not reached the predetermined time. In this case (NO at step S110), the entire processing is returned to the main routine. Therefore, an estimation process is not executed.

The processes of steps S120-S160 are directed to estimating the internal resistance of the secondary battery. Since the processes of steps S120-S160 are similar to those of steps S20-S60, description thereof will not be repeated.

Step S180 is a process to stop converter 12 subsequent to estimation of the internal resistance of the secondary battery. As set forth above, stopping unit 119 (refer to FIG. 3) responds to reception of an estimate value RB to output a command to stop generation of control signal PWD to PWM signal generation unit 117. Upon completion of the process of step S180, the entire processing is returned to the main routine.

The internal resistance of a secondary battery can be estimated periodically by execution of the processing shown in FIG. 13. At step S110, a determination can be made based on whether the running distance of the electric powered vehicle on which motor drive device 100 is mounted has reached a predetermined value or not. When a determination is made that the running distance of the electric powered vehicle has reached the predetermined value, the processes of steps S120 to S180 are executed. The internal resistance of a secondary battery can be estimated periodically similarly in this case.

In the case where the processing shown in FIG. 13 is executed, control device 30 preferably obtains the detection value of current 1B during one period Tx. By detecting current IB in a short period of time, power consumption of the electric energy stored at secondary battery 1 can be reduced.

The internal resistance of secondary battery 1 estimated by estimating unit 104 is used for determining degradation in secondary battery 1, adjustment of the carrier frequency, and the like.

FIG. 14 is a flowchart representing a determination process by the degradation determining unit shown in FIG. 2. Referring to FIG. 14, degradation determining unit 105 obtains an estimate value of the internal resistance of the secondary battery from estimating unit 104 at step S210. At step S220, degradation determining unit 105 determines degradation in secondary battery 1 based on the estimate value. For example, degradation determining unit 105 compares the estimate value with a reference value, and determines that secondary battery 1 is degraded when the estimate value is smaller than the reference value.

The correlative relationship between the estimate value of the internal resistance and degradation in the secondary battery may be defined in advance by experiments and the like, and stored at degradation determining unit 105 in the form of a map. In this case, degradation determining unit 105 can obtain the degree of degradation in the secondary battery based on the map and the estimate value from estimating unit 104. Further, degradation determining unit 105 can estimate the degradation in the secondary battery based on the degree of degradation. The determination result by degradation determining unit 105 may be output to an external source, for example, or stored in degradation determining unit 105.

Figure 15:
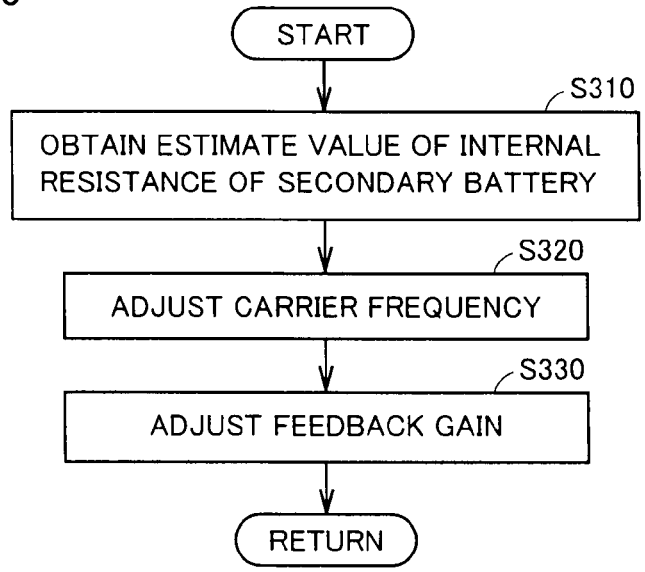
FIG. 15 is a flowchart to describe control of a converter by a converter control unit shown in FIG. 2.

FIG. 15 is a flowchart to describe control of the converter by the converter control unit shown in FIG. 2. Referring to FIG. 15, converter control unit 102 obtains an estimate value of the internal resistance of the secondary battery from estimating unit 104 at step S310. At step S320, converter control unit 102 (carrier generation unit 118) adjusts the frequency of carrier wave CW in a normal operation mode of converter 12, i.e. carrier frequency fo, based on the estimate value. Specifically, carrier generation unit 118 stores a map defining a correlative relationship between the carrier frequency and the estimate value of the internal resistance of the secondary battery, and sets the carrier frequency based on that map and the estimate value from estimating unit 104.

Figure 16:
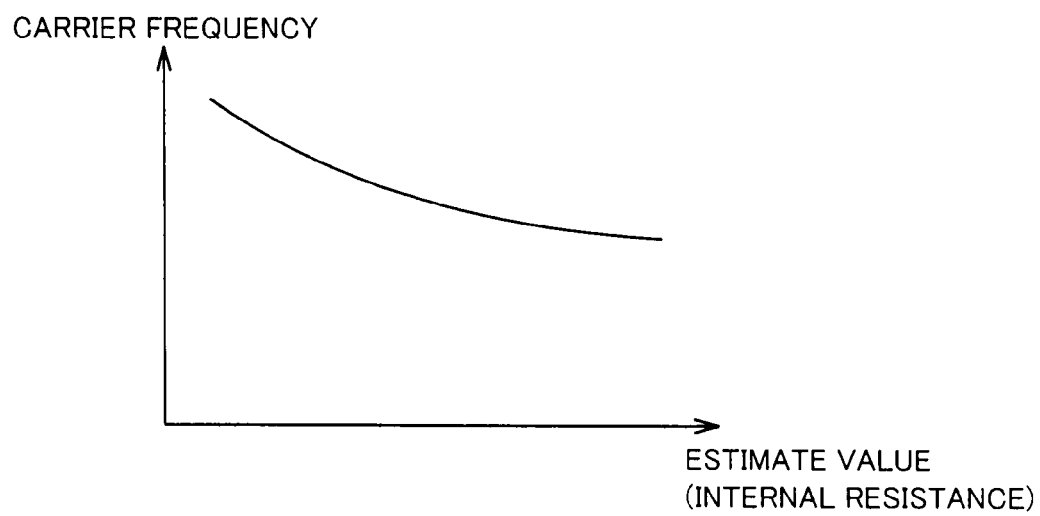
FIG. 16 is a diagram to describe a map stored in a carrier generation unit.

FIG. 16 is a diagram to describe the map stored in the carrier generation unit. Referring to FIG. 16, the carrier frequency is expressed as a function of the internal resistance of the secondary battery. The carrier frequency becomes higher as the internal resistance becomes lower. The type of the aforementioned function is not particularly limited as long as this relationship is met.

Returning to FIG. 15, converter control unit 102 (feedback control unit 112) reduces the feedback gain based on the estimate value from estimating unit 104 at step S330. Specifically, feedback control unit 112 reduces the feedback gain as the estimate value (RB) becomes lower.

In the case where the internal resistance of secondary battery 1 is low, the instantaneous value of reactor current IL increases since the amplitude of the ripple current becomes larger. Increase of the instantaneous value of reactor current IL leads to the possibility of generation of current exceeding the tolerable maximum current of the structural components of converter 12 (typically, the rated maximum current of IGBT elements Q1 and Q2).

In the present embodiment, the carrier frequency is adjusted based on an estimate value of the internal resistance. Specifically, the carrier frequency becomes higher as the estimate value of the internal resistance becomes smaller. A higher carrier frequency causes a smaller amplitude of the ripple current. Accordingly, damage of the structural components of converter 12 can be prevented.

The motor drive system includes a power supply system with converter 12. System voltage VH varies by the LC resonance at converter 12. This amount of variation of system voltage VH depends on the damping ratio of converter 12. The amount of variation of system voltage VH becomes smaller as the damping ratio becomes larger.

The damping ratio of converter 12 varies according to the internal resistance of secondary battery 1. The damping ratio is smaller as the internal resistance is lower. Accordingly, the amount of variation of system voltage VH is increased.

For example, the user of an electric power vehicle incorporating motor drive device 100 may strongly step on the accelerator pedal for acceleration. In this case, the output power of AC motor M1 suddenly rises. In the case where the internal resistance of secondary battery 1 is low, system voltage VH will greatly increase instantaneously. In this case, there is a possibility of generation of voltage exceeding the breakdown voltage of the structural components of inverter 14 (typically, IGBT elements).

In the present embodiment, the feedback gain employed for control of converter 12 is adjusted based on the estimate value of the internal resistance. Specifically, the feedback gain becomes smaller as the estimate value of the internal resistance becomes lower. Reduction in the feedback gain suppresses variation in system voltage VH when the required value of output power of AC motor M1 varies greatly. Therefore, the event of system voltage VH exceeding the breakdown voltage of the structural components of inverter 14 (typically, IGBT elements) can be avoided even in the case where the internal resistance of the secondary battery is low.

In the present embodiment, the motor drive system is incorporated in an electric powered vehicle (hybrid vehicle, electric car, fuel cell vehicle, and the like). The application of the motor drive system based on the configuration shown in FIG. 1 is not particularly limited.

Further, the configuration of the converter is not particularly limited as long as a ripple current can be generated at the secondary battery.

Although a secondary battery is employed as a power storage device in the present embodiment, the type of the power storage device is not particularly limited as long as it has internal resistance. For example, a capacitor of large capacitance may be employed as the power source of the motor drive device. Since a capacitor similarly has internal resistance, the present invention is also applicable to a device for estimating the internal resistance of a capacitor.

Although the present invention has been described and illustrated in detail, it is clearly understood that the same is by way of illustration and example only and is not to be taken by way of limitation, the scope of the present invention being interpreted by the terms of the appended claims.

What is claimed is:

1. An internal resistance estimation apparatus for a power storage device, comprising:
   a ripple generation unit configured to generate a ripple current of a predetermined frequency at said power storage device,
   a current detection unit configured to detect said ripple current,
   a temperature detection unit configured to detect a temperature of said power storage device,
   a storage unit configured to store a predetermined correlative relationship between the temperature and said ripple current of said power storage device, and internal resistance of said power storage device, and
   an estimating unit configured to estimate said internal resistance based on said ripple current detected by said current detection unit, said temperature detected by said temperature detection unit, and said correlative relationship stored in said storage unit.

2. The internal resistance estimation apparatus for a power storage device according to claim 1, further comprising a determining unit configured to determine whether warm-up control to increase said temperature of said power storage device is required or not based on said temperature detected by said temperature detection unit,
   wherein said ripple generation unit generates said ripple current at said power storage device when said determining unit determines that said warm-up control is required.

3. The internal resistance estimation apparatus for a power storage device according to claim 2, wherein said estimating unit is configured to obtain a current value of said ripple current from said current detection unit during one period of said ripple current, and estimate said internal resistance based on said current value, said temperature, and said correlative relationship.

4. The internal resistance estimation apparatus for a power storage device according to claim 3, wherein
   said ripple generation unit includes a voltage converter configured to convert a level of DC voltage between said power storage device and a load driven by electric power supplied from said power storage device,
   said voltage converter includes a switching element subjected to ON/OFF control at a period according to a carrier frequency, and
   a reactor connected in series with said switching element to said power storage device,
   said internal resistance estimation device further comprising a frequency setting unit for setting said carrier frequency at said predetermined frequency.

5. The internal resistance estimation apparatus for a power storage device according to claim 4, wherein said power storage device includes a secondary battery.

6. A degradation determination apparatus for a power storage device, comprising:
   a ripple generation unit configured to generate a ripple current of a predetermined frequency at said power storage device,
   a current detection unit configured to detect said ripple current,
   a temperature detection unit configured to detect a temperature of said power storage device,
   a storage unit configured to store a predetermined correlative relationship between the temperature and said ripple current of said power storage device, and internal resistance of said power storage device,
   an estimating unit configured to estimate said internal resistance based on said ripple current detected by said current detection unit, said temperature detected by said temperature detection unit, and said correlative relationship stored in said storage unit, and
   a degradation determining unit configured to determine whether said power storage device is degraded or not based on said internal resistance estimated by said estimating unit.

7. A power supply system to supply electric power to a load mounted on a vehicle, said power supply system comprising:
   a power storage device;
   a voltage converter configured to convert a level of DC voltage between said power storage device and said load,
   said voltage converter including
      a switching element subjected to ON/OFF control at a period according to a carrier frequency, and
      reactor connected in series with said switching element to said power storage device;
   a frequency setting unit configured to set said carrier frequency at a first frequency directed to generating a ripple current at said power storage device when estimating internal resistance of said power storage device, and to allow setting of said carrier frequency at a second frequency higher than said first frequency when driving said load;
   a current detection unit configured to detect said ripple current;
   a temperature detection unit configured to detect a temperature of said power storage device;

a storage unit configured to store a predetermined correlative relationship between said temperature and said ripple current of said power storage device, and said internal resistance of said power storage device; and an estimating unit configured to estimate said internal resistance based on said ripple current detected by said current detection unit, said temperature detected by said temperature detection unit, and said correlative relationship stored in said storage unit.

8. The power supply system according to claim 7, wherein said frequency setting unit is configured to adjust said second frequency based on said internal resistance estimated by said estimating unit.

9. The power supply system according to claim 7, wherein said load includes an AC motor, and an inverter configured to allow conversion of DC voltage supplied from said voltage converter into AC voltage to drive said AC motor.

* * * * *